United States Patent
Wang

(10) Patent No.: US 9,886,988 B1
(45) Date of Patent: Feb. 6, 2018

(54) MEMORY CELL HAVING A REDUCED PEAK WAKE-UP CURRENT

(71) Applicant: Taiwan Semiconductor Manufacturing Co., Ltd., Hsin-Chu (TW)

(72) Inventor: Bing Wang, Palo Alto, CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/360,761

(22) Filed: Nov. 23, 2016

(51) Int. Cl.
*G11C 7/00* (2006.01)
*G11C 7/12* (2006.01)

(52) U.S. Cl.
CPC .................................. *G11C 7/12* (2013.01)

(58) Field of Classification Search
CPC ....... G11C 11/22; G11C 7/12; G11C 16/0483; G11C 11/4091; G11C 13/0011; G11C 16/10; G11C 16/24; G11C 16/3454; G11C 16/3459; G11C 7/062; G11C 11/1673; G11C 13/0002; G11C 13/004; G11C 2013/0042
USPC .......... 365/145, 189.05, 149, 203, 205, 148, 365/207, 185.22, 185.25, 189.11, 189.15, 365/191, 194, 208, 222, 226, 230.08
See application file for complete search history.

(56) References Cited

U.S. PATENT DOCUMENTS

| | | | |
|---|---|---|---|
| 8,421,205 B2 | 4/2013 | Yang | |
| 8,661,389 B2 | 2/2014 | Chern et al. | |
| 8,698,205 B2 | 4/2014 | Tzeng et al. | |
| 8,826,212 B2 | 9/2014 | Yeh et al. | |
| 8,836,141 B2 | 9/2014 | Chi et al. | |
| 8,875,076 B2 | 10/2014 | Lin et al. | |
| 9,147,029 B2 | 9/2015 | Ke et al. | |
| 2009/0285032 A1* | 11/2009 | Choi | G11C 7/065 365/189.05 |
| 2014/0264924 A1 | 9/2014 | Yu et al. | |
| 2014/0282289 A1 | 9/2014 | Hsu et al. | |
| 2015/0063007 A1* | 3/2015 | Choi | G11C 11/419 365/154 |
| 2015/0279453 A1 | 10/2015 | Fujiwara et al. | |
| 2015/0318241 A1 | 11/2015 | Chang et al. | |
| 2015/0347659 A1 | 12/2015 | Chiang et al. | |
| 2015/0357279 A1 | 12/2015 | Fujiwara et al. | |
| 2016/0012169 A1 | 1/2016 | Chiang et al. | |

* cited by examiner

*Primary Examiner* — Thong Q Le
(74) *Attorney, Agent, or Firm* — Duane Morris LLP

(57) ABSTRACT

In various embodiments, a circuit includes a first switch coupled to a voltage source and a bit-line (BL). The first switch is configured to couple the BL to the voltage source to charge the BL in response to a charge control signal. A second switch is coupled to the voltage source and a complimentary bit-line (BLB) and is configured to couple the BLB to the voltage source to charge the BLB in response to the charge control signal. A control circuit is electrically coupled to each of the first switch and the second switch. The control circuit is configured to generate the charge control signal. The charge control signal is configured to control the first switch and the second switch to selectively couple the BL and the BLB to the voltage source to charge the BL and the BLB from an initial voltage to a first predetermined voltage during a first discrete charging period and from the first voltage to a second predetermined voltage during a second discrete charging period.

20 Claims, 6 Drawing Sheets

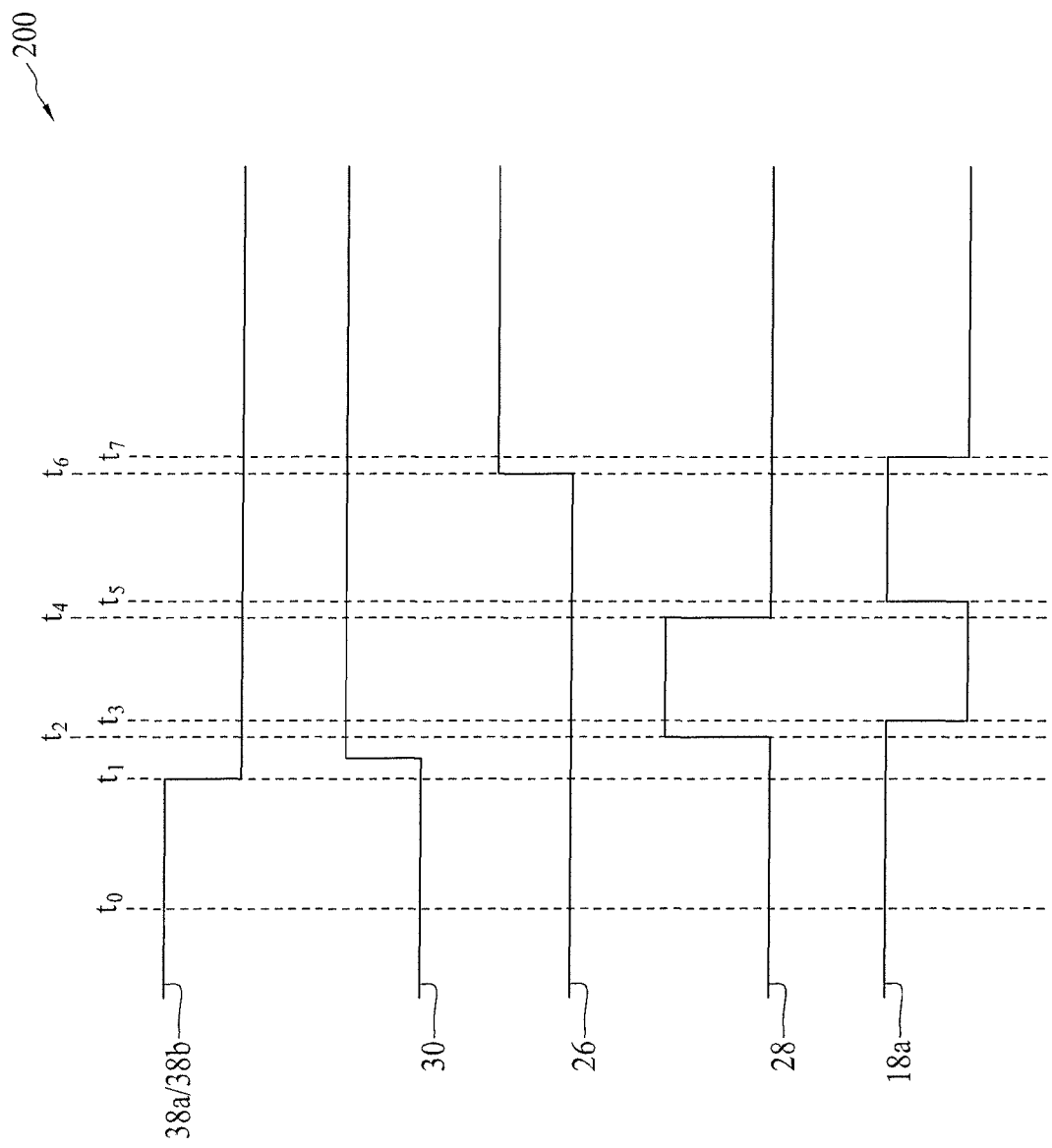

US 9,886,988 B1

1

MEMORY CELL HAVING A REDUCED PEAK WAKE-UP CURRENT

FIELD

This disclosure relates to random-access memory (RAM), and more specifically, to bit-line charging in a RAM array.

BACKGROUND

Current random-access memory (RAM) array designs (such as static-RAM (SRAM) arrays, dynamic-RAM (DRAM) arrays, etc.) experience high peak currents during pre-charging operations (e.g., wake-up or start-up operations). During normal operation, a RAM array only utilizes (e.g., discharges/charges) a predetermined number of bit-lines (BL) and complimentary bit-lines (BLB). For example, in some embodiments, RAM array is configured to read/write a maximum of 72 of the total number of bit-lines in the RAM array during a read/write operation (referred to herein as a two-multiplexer (2mux) design). As another example, in some embodiments, a RAM array is configured to read/write a maximum of about ¼ of the total bit-lines in the RAM array during a read/write operation (referred to herein as a four-multiplexer (4mux) design). The RAM array experiences a read/write peak current based on the maximum number of BLs and BLBs used during a read/write operation.

During a pre-charging operation (e.g., start-up/wake-up operation), each of the BLs and BLBs in the RAM array are charged, resulting in a charge peak current having value greater than the read/write peak current. Conventional memory units utilize a signal bit-line precharge stage that charges all of the BLs and BLBs in the RAM array from a sleep/off state to a charged state in a single charging cycle. The charge peak current during a charge operation can exceed, for example, 300 μA. The high charge peak currents can cause damage to one or more circuit elements in the RAM array and/or circuit elements connected to the RAM array.

BRIEF DESCRIPTION OF THE DRAWINGS

Aspects of the present disclosure are best understood from the following detailed description when read with the accompanying figures. It is noted that, in accordance with the standard practice in the industry, various features are not necessarily drawn to scale. In fact, the dimensions of the various features may be arbitrarily increased or reduced for clarity of discussion.

FIG. 6 is a timing diagram of the charge control circuit of FIG. 4, in accordance with some embodiments.

2

DETAILED DESCRIPTION

This description of the exemplary embodiments is intended to be read in connection with the accompanying drawings, which are to be considered part of the entire written description. Terms concerning attachments, coupling and the like, such as "connected," "interconnected," "electrically connected," and "electrically coupled" refer to a relationship wherein structures are electrically attached or coupled to one another, either directly or indirectly through intervening circuit elements, as well as both wired or wireless attachments or relationships, unless expressly described otherwise.

In various embodiments, a memory unit includes a BL/BLB charging cell configured to charge one or more BLs/BLBs during a multi-stage pre-charging process. In some embodiments, the charging cell is configured to charge one or more BL/BLBs to a first predetermined voltage level. The BL/BLB charging cell pauses charging the BL/BLB for a predetermined delay period after reaching the first predetermined voltage. The BL/BLB charging cell then charges the BL/BLB to a second predetermined voltage after the predetermined delay period. In some embodiments, the BL/BLB charging cell includes a charging control circuit configured to generate one or more control signals for the multi-stage charging process.

Figure 1:
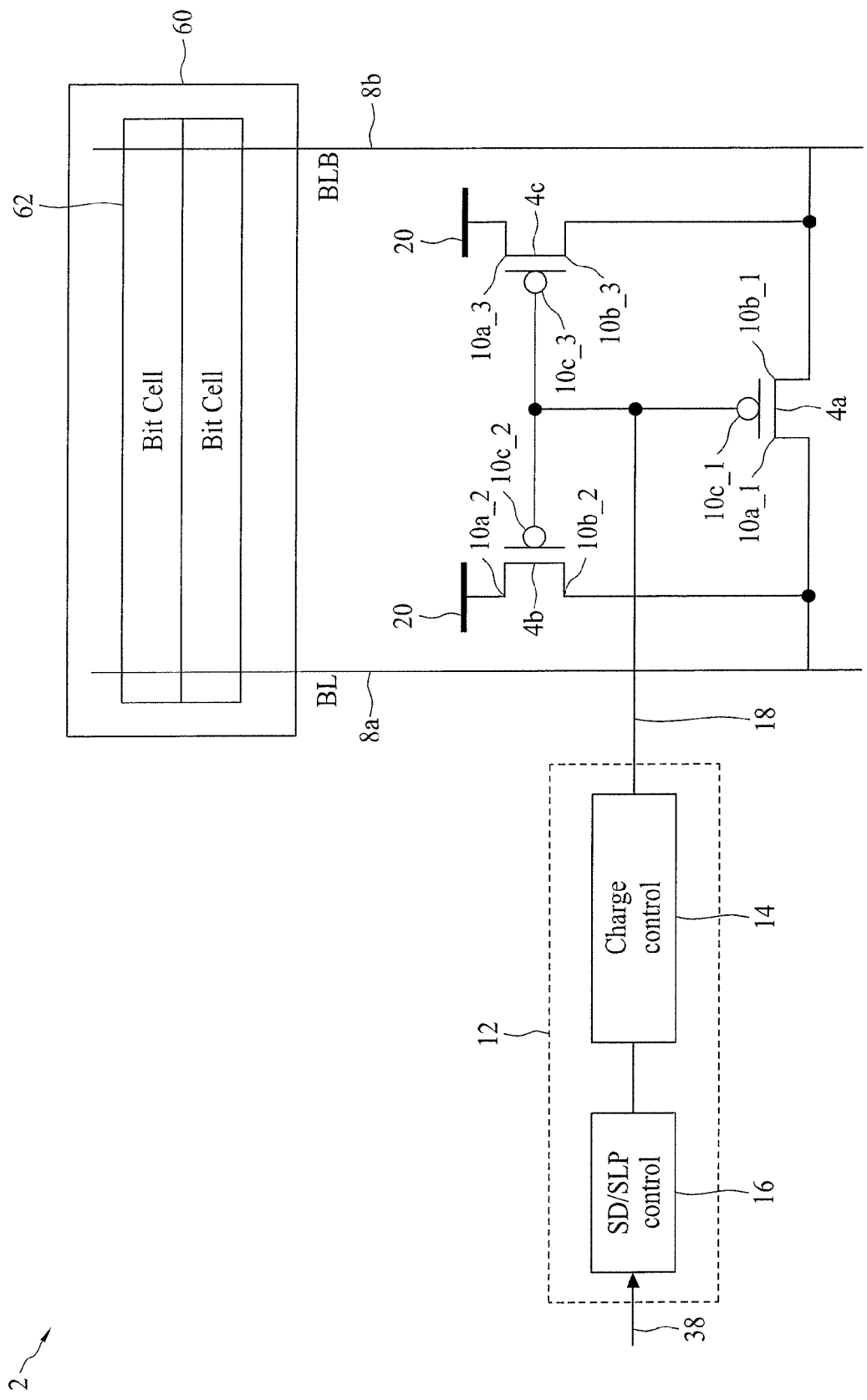
FIG. 1 illustrates a charging cell of a memory unit having a multi-stage charging control circuit, in accordance with some embodiments.

FIG. 1 illustrates one embodiment of a BL/BLB charging cell 2 of a memory array (not shown), in accordance with some embodiments. The BL/BLB charging cell 2 includes a plurality of charging transistors 4a-4c (collectively "charging transistors 4"). Each of the charging transistors 4 can comprise any suitable transistor, such as, for example, one or more complimentary metal-oxide-semiconductor (CMOS) transistors, such as a metal-oxide-semiconductor field-effect transistors (MOSFET), n-channel MOSFETs (NMOS), p-channel MOSFETs (PMOS), and/or any other suitable transistor. In some embodiments, the charging transistors 4 are configured to control one or more pre-charging/charging operations of a BL 8a and/or a BLB 8b. Although charging transistors 4 are illustrated herein, it will be appreciated that the charging transistors 4 can be replaced with any suitable switching element.

In some embodiments, a first charging transistor 4a is coupled between each of a BL 8a and BLB 8b. In some embodiments, the first charging transistor 4a is coupled to the BL 8a at a first source/drain terminal 10a_1 and coupled to the BLB 8b a second source/drain terminal 10b_2. The gate 10c_1 of the first charging transistor 4a is coupled to a charge control circuit 12. In some embodiments, the first charging transistor 4a can be omitted.

In some embodiments, a second charging transistor 4b is coupled between an input voltage 20 and the BL 8a. The second charging transistor 4b is coupled to the input voltage 20 at a first source/drain terminal 10a_2 and the BL 8a at a second source/drain terminal 10b_2. The second source/drain terminal 10b_2 of the second charging transistor 4b is further coupled to the first source/drain terminal 10a_1 of the first charging transistor 4a. The first source/drain terminal 10a_2 of the second charging transistor 4b is coupled to the input voltage 20. The gate 10c_2 of the second charging transistor 4b is coupled to the charge control circuit 12.

In some embodiments, a third charging transistor 4c is coupled between the input voltage 20 and the BLB 8b. The third charging transistor 4c is coupled to the input voltage 20 at a first source/drain terminal 10a_3 and the BLB 8b at a second source/drain terminal 10b_3. The second source/drain terminal 10b_3 of the third charging transistor 4c is further coupled to the second source/drain terminal 10b_1 of the first charging transistor 4a. The first source/drain terminal 10a_3 of the third charging transistor 4c is coupled to the input voltage 20. The gate 10c_3 of the third charging transistor 4c is coupled to the charge control circuit 12. In some embodiments, the input voltage 20 is a variable voltage signal. For example, in some embodiments, the input voltage 20 can be set to one or more discrete voltage values, such as a first predetermined voltage and a second predetermined voltage, although it will be appreciated that input voltage 20 can have additional and/or alternative voltage levels. Although embodiments are discussed herein including the second and third charging transistors 4b, 4c each coupled to a single input voltage 20, it will be appreciated that the second charging transistor 4b can be coupled to a first voltage input and the third charging transistor 4c can be coupled to a second voltage input.

As noted above, the gate 10c of each of the charging transistors 4 is coupled to the charge control circuit 12. The charge control circuit 12 generates a charge control signal 18 which controls charging of the BL 8a and/or the BLB 8b according to a multi-stage charging process. The charge control circuit 12 is configured to receive one or more input signals 38, such as sense drive (SD) signal and/or a sleep (SLP) signal and generate a charge control signal 18. In some embodiments, the charge control signal 18 is a logic signal (i.e., a signal having a first voltage level representative of a first logic state and a second voltage level representative of a second logic state). The charge control signal 18 controls operation of the charging transistors 4.

In some embodiments, the charging transistors 4 are configured to charge the BL 8a and/or the BLB 8b during a multi-stage charging process controlled by the charge control circuit 12. For example, in some embodiments, the charge control circuit 12 is configured for a two-stage charging process. The charge control circuit 12 controls the charge control signal 18 to selectively activate and/or deactivate the charging transistors 4 to charge the BL 8a and/or the BLB 8b in multiple discrete charging phases. For example, in some embodiments, the charge control signal 18 has an initial first predetermined value that maintains the charging transistors 4 in an off-state. The input voltage 20 is initially set to a first predetermined voltage. When a two-stage charging process is initiated, the charge control circuit 12 sets the charge control signal 18 to a second predetermined value configured to turn on the charging transistors 4, which charge the BL 8a and/or BLB 8b to the first predetermined voltage. The charge control circuit 12 then resets the charge control signal 18 to the first predetermined value to turn the charge transistors 4 off. The charge transistors 4 are maintained in an off state for a predetermined delay period (e.g., the charge control signal 18 is maintained at the first predetermined value for the predetermined delay period). During the delay period, the input voltage 20 can be increased to a second predetermined voltage. The charge control circuit 12 subsequently sets the charge control signal 18 back to the second predetermined value to turn on the charging transistors 4, which charge the BL 8a and/or BLB 8b to the second predetermined voltage. The second predetermined voltage is greater than the first predetermined voltage.

In some embodiments, the first predetermined voltage is about half the second predetermined voltage, although it will be appreciated that the first predetermined voltage can be any voltage less than the second predetermined voltage. In some embodiments, the second predetermined voltage is equal to a positive supply voltage of the memory array (commonly referred to as VDD). Although embodiments are discussed herein including a two-stage charging process, it will be appreciated that the charge control circuit 12 can be configured to charge the BL 8a and/or the BLB 8b using a multi-stage charging process having any number of discrete charging cycles, such as, for example, a two, three, four, and/or a greater number of discrete charging cycles. The number of discrete charging cycles correspond to the number of voltage levels of the BL 8a and/or BLB 8b and/or the number of voltage levels of the input voltage 20 during a multi-stage charging process.

The multi-stage charging process reduces the peak current on each of the BL 8a and/or the BLB 8b during a charge/pre-charge operation. In some embodiments, the predetermined delay period and the first input voltage are selected to reduce a peak current experienced during the charge/pre-charge operation by a predetermined factor. The peak current can have a positive value (such as some PMOS-based designs) or a negative value (such as some NMOS-based designs). For example, in conventional BL/BLB charge operations, the peak current on each of the BL/BLB can exceed 300/−300 mA. A multi-stage charging process, such as the two-stage charging process described above, can be configured to introduce a predetermined delay period which reduces the peak current to about 200/−200 mA, which is a ⅓ reduction. In some embodiments, the predetermined delay period and/or the first input voltage can be selected such that the peak current on each of the BL 8a and/or the BLB 8b during a charge operation is equal to or less than a peak current experienced during a read and/or write operation.

In some embodiments, the charge control circuit 12 includes a charge control block 14 and a SD/SLP control block 16. The SD/SLP control block 16 is configured to receive one or more input signals 38, such as an SD signal and an SLP signal, and generate control signals for the charge control block 14. For example, in some embodiments, the SD/SLP control block 16 includes a plurality of logic gates and/or delay blocks configured to generate one or more control signals for the charge control block 14, as described in more detail below with respect to FIGS. 4-5. The charge control block 14 receives one or more signals from the SD/SLP control block 16 and generates the charge control signal 18. For example, in some embodiments, the charge control block 14 includes a plurality of logic gates and/or delay blocks configured to generate a charge control signal 18 based on an input from the SD/SLP control block 16, as described in more detail below with respect to FIGS. 4-6.

In some embodiments, the BL 8a and/or the BLB 8b are coupled to a memory array 60. The memory array 60 can include one or more bit cells 62 coupled to each of the BL 8a and/or the BLB 8b. In some embodiments, the one or more bit cells 62 are configured to use the BL 8a and/or the BLB 8b during one or more operations, such as, for example, a read/write operation.

Figure 2:
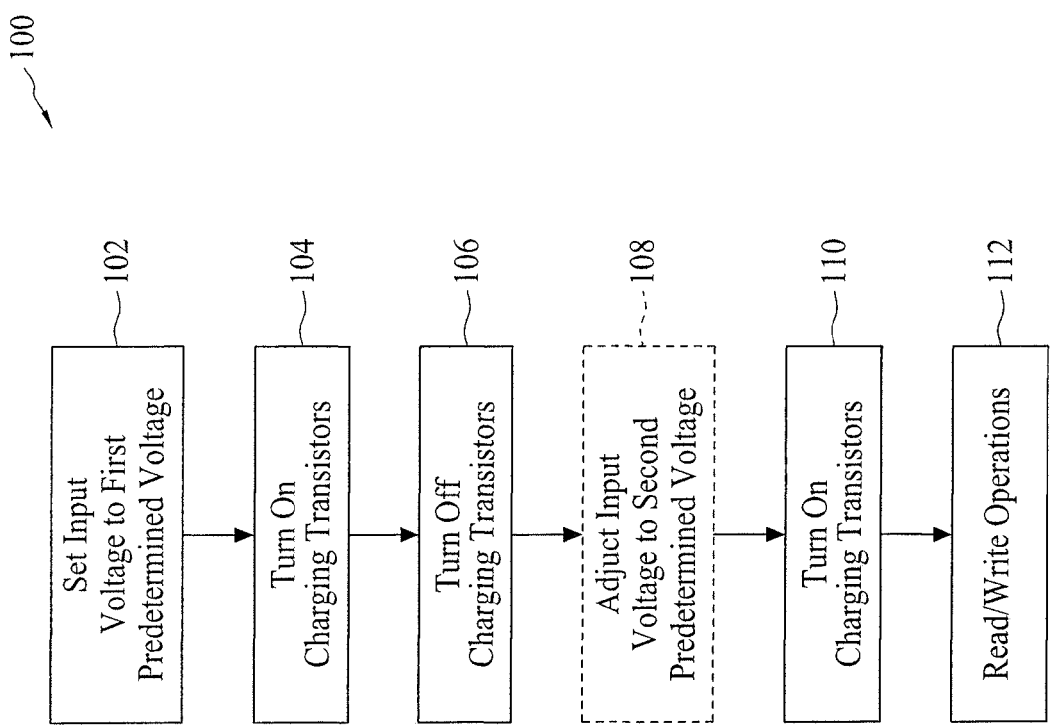
FIG. 2 is a flowchart illustrating a method of operation of the charging cell of FIG. 1, in accordance with some embodiments.

FIG. 2 is a flowchart illustrating a method 100 of operation of the BL/BLB charging cell 2 of FIG. 1, in accordance with some embodiments. As shown in FIG. 2, at a first step 102, the input voltage 20 is set to a first input voltage. The first input voltage can be any suitable value for charging a BL 8a and/or a BLB 8b. In some embodiments, the first input voltage is less than or equal to a positive supply voltage of a memory array (VDD). When a charge/pre-charge operation is required (such as during start-up or wake-up procedure), the BL/BLB charging cell 2 transitions to step 104. At step 104, the charge control circuit 12 turns on the charging transistors 4 to charge a BL 8a and/or a BLB 8b to a voltage value less than or equal to the first voltage input. In some embodiments, the charge control circuit 12 turns the charging transistors 4 on by transitioning a charge control signal 18 from the first predetermined value (configured to maintain the charging transistors 4 in an off-state) to a second predetermined value (configured to turn the charging transistors 4 on). The charge control signal 18 can be a set-high signal (e.g., the first predetermined value is less than the second predetermined value) or a set-low signal (e.g., first predetermined value is greater than the second predetermined value). When the charging transistors 4 are turned on, the BL 8a and/or the BLB 8b are charged from a starting value (such as ground) to the first input voltage. For example, when the second charging transistor 4b is turned on, BL 8a is connected to the input voltage 20 and is charged to the first input voltage. Similarly, when the third charging transistor 4c is turned on, the BLB 8b is connected to the input voltage 20 and is charged to the first input voltage.

The charge control circuit 12 maintains the charge control signal 18 at the second predetermined value until the BL 8a and/or the BLB 8b have been charged to the first input voltage. The first input voltage can be any suitable voltage value less than a positive supply voltage of a memory array, such as, for example, half the positive supply voltage, one fourth the positive supply voltage, three-fourths the positive supply voltage, and/or any other suitable voltage value between an uncharged BL/BLB (e.g., ground or a negative supply voltage (VSS)) and a fully charged BL/BLB (e.g., VDD).

At step 106, the charge control circuit 12 resets the charge control signal 18 to the first predetermined value to turn the charging transistors 4 off. The charge control circuit 12 maintains the charge control signal 18 at the first predetermined value for a predetermined delay period. The predetermined delay period is selected to reduce a peak current on the BL 8a and/or the BLB 8b during a charge operation. For example, in some embodiments, the predetermined delay period is selected such that the peak current on the BL 8a and/or BLB 8b during a charge operation is less than or equal to a peak current on the BL 8a and/or the BLB 8b during a read/write operation. In some embodiments, the BL/BLB charging circuit 2 transitions to an optional step 108 during the predetermined delay period.

At step 108, the input voltage 20 is adjusted from the first predetermined voltage to a second predetermined voltage. The second predetermined voltage is greater than the first predetermined voltage. The input voltage 20 can be adjusted by one or more circuit elements, such as, for example, one or more circuit elements of the charge control circuit 12 and/or additional memory array circuit elements (not shown). In some embodiments, the voltage 20 is a virtual voltage and can be coupled to one or more control elements. For example, in one embodiment, VDDI is coupled to a transistor (such as a PMOS transistor) coupled to a high voltage at a first source/drain terminal and VDDI at a second source/drain terminal. When the transistor is off, VDDI is at a floating low-voltage and when the transistor is on, VDDI is connected to VDD. After adjusting the input voltage (or skipping step 108), the BL/BLB charging circuit 2 transitions to step 110.

At step 110, the control circuit 12 again sets the charge control signal 18 to the second predetermined value to turn on the charging transistors 4. The BL 8a and/or the BLB 8b charge from the first predetermined voltage to the second predetermined voltage. Although embodiments are discussed herein having a second charge cycle charging the BL 8a and/or the BLB 8b from the first predetermined voltage to the second predetermined voltage, it will be appreciated that, in some embodiments, the BL 8a and/or the BLB 8b may have some voltage discharge during the predetermined delay period such that when the charging transistors 4 are reactivated for the second charging cycle (or any other subsequent charging cycle), the voltage on the BL 8a and/or the BLB 8b may be a value less than the first predetermined voltage. When the BL 8a and/or the BLB 8b is charged to the second predetermined voltage (e.g., after a predetermined time period has elapsed), the BL/BLB charging cell 2 transitions to step 112.

At step 112, one or more read/write operations are performed by a memory array coupled to the BL 8a and/or the BLB 8b. The charge control signal 18 can be maintained at the second predetermined value to maintain a charge on the BL 8a and/or BLB 8b at the second predetermined voltage and/or can be reset to the first predetermined value to turn the charging transistors 4 off. In some embodiments, one or more ready signals can be generated to indicate that the BL 8a and/or the BLB 8b are fully charged.

Although embodiments are discussed herein in which the input voltage 20 is adjusted from a first predetermined voltage to a second predetermined voltage, it will be appreciated that, in some embodiments, the input voltage 20 maintains a constant voltage value during both the first and second charging cycles. The charging control circuit 12 is configured to control the charge control signal 18 such that the charging transistors 4 are turned on during the first charging cycle for a period sufficient to charge the BL 8a and/or the BLB 8b only to the first predetermined voltage.

Figure 3:
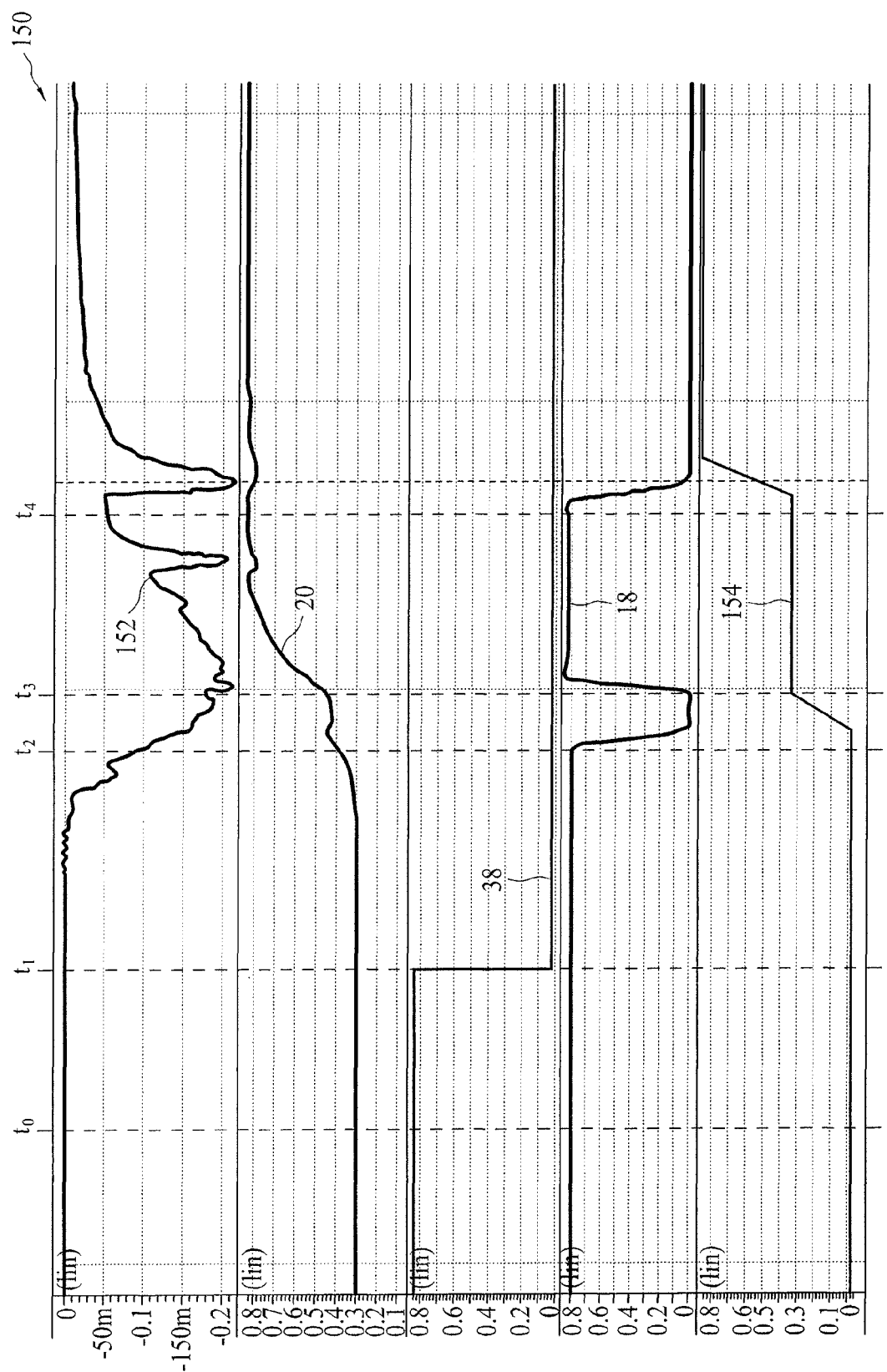
FIG. 3 illustrates a timing diagram of the charging cell of FIG. 1 during a two-stage charging process, in accordance with some embodiments.

FIG. 3 is a timing diagram 150 of the charging cell 2 of FIG. 1 during a charge operation, in accordance with some embodiments. As shown in FIG. 3, at time to, an SLP signal 38 has a first predetermined value corresponding to a sleep-mode of a memory array attached to the charging cell 2 of FIG. 1. The charge control signal 18 has a first predetermined value configured to maintain the charging transistors 4 in an off-state and BL 8a and/or BLB 8b are uncharged (e.g., have a voltage value 154 of zero). The input voltage 20 has a first predetermined value. At time $t_1$, the SLP signal 38 transitions to a second predetermined value (e.g., set to a logic low value) to indicate a wake-up operation of the memory array attached to the BL/BLB charging cell 2. At time $t_2$, the charge control signal 18 is set to a second predetermined value (e.g., logic low) to turn on the charging transistors 4. Between time $t_2$ and $t_3$, a BL/BLB voltage 154 is charged from an initial value (e.g., ground) to the first predetermined voltage by the input voltage 20. In the illustrated embodiment, the first predetermined voltage is 0.3V, less than half of a maximum charge value of a BL/BLB voltage 154, although it will be appreciated that the first predetermined voltage can be any value less than the maximum charge value of the BL/BLB voltage 154. At time $t_3$, the BL/BLB voltage 154 is charged to the first predetermined voltage, and the charge control signal 18 is reset to the first predetermined value to turn the charging transistors 4 off. During the predetermined delay period (time $t_3$ to $t_4$), the input voltage 20 is adjusted from the first predetermined value to a second predetermined value. In the illustrated embodiment, the second predetermined value is equal to about 0.8V. After the predetermined delay period has elapsed, the charge control signal 18 is again set to the second predetermined value and the BL/BLB voltage 154 is charged from the first predetermined voltage to the second predetermined voltage. The second predetermined voltage corresponds to a fully charged BL/BLB. As shown in FIG.

3, the peak current 152 does not exceed about −200 mA during the charging process. In some embodiments, such as the illustrated embodiment, the peak current is negative as one or more circuit elements utilize an NMOS (or pull-down) configuration which generates a negative peak current, although it will be appreciated that the peak current can be a positive current value.

Figure 4:
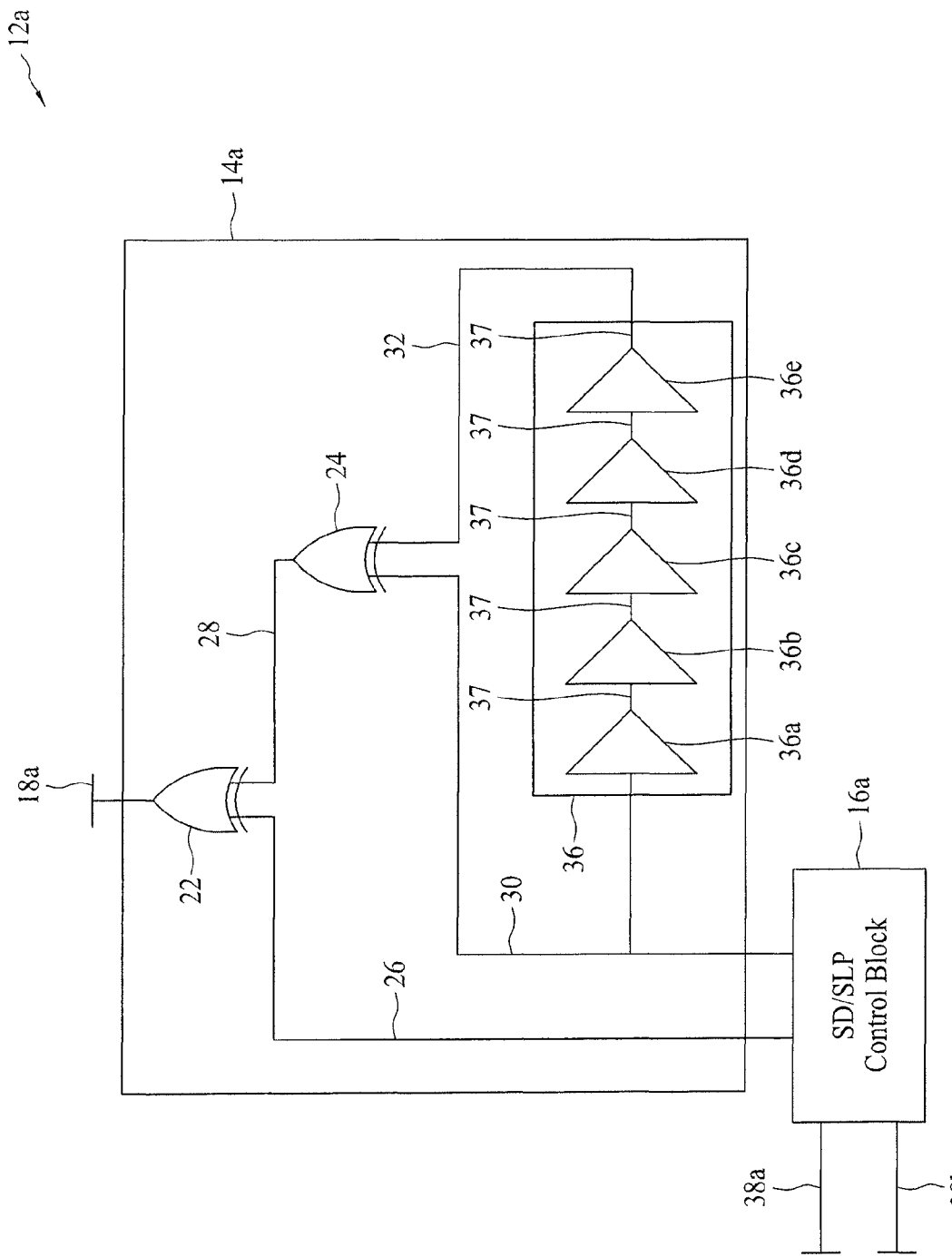
FIG. 4 illustrates a charge control circuit of the charging cell of FIG. 1, in accordance with some embodiments.

FIG. 4 illustrates a charge control circuit 12a including additional details of a charge control block 14a, in accordance with some embodiments. The charge control bock 14a is configured to generate a charge control signal 18a. The charge control signal 18a is generated by one or more logic gates 22, 24. For example, in the illustrated embodiment, an output gate 22 receives a first charge signal 26 from an SD/SLP control block 16a and a second charge signal 28 from a control gate 24. The control gate 24 receives a first control signal 30 from the SD/SLP control block 16a and a second control signal 32 from a first delay block 36. In some embodiments, the second control signal 32 is a delayed version of control signal 30 and is generated by applying a predetermined time delay to the first control signal 30. In the illustrated embodiment, the output gate 22 and the control gate 24 each comprise an XOR gate, although it will be appreciated that specific logic gates are provided only as an example and any suitable combination of logic gates may be used and is within the scope of this disclosure.

The second control signal 32 can be generated by a first delay block 36. The first delay block 36 includes a plurality of delay elements 36a-36e configured to propagate a signal from a first side to a second side of the delay element 36a-36e with a predetermined delay. Each of the delay elements 36a-36e adds a predetermined partial delay to the predetermined time delay of the delay block 36. The predetermined time delay can be increased and/or decreased by varying the number of delay elements 36a-36e within the first delay block 36. The delay elements 36a-36e can comprise any suitable delay element, such as, for example, a plurality of transistors, logic gates, and/or any other suitable delay elements. In some embodiments, the predetermined delay of the first delay block 36 can be further adjusted based on material of the signal lines 37 connecting each of the delay elements 36a-36e. For example, in some embodiments, the signal lines 37 can include various materials configured to increase and/or decrease the delay of the delay block 36, such as, for example, a poly (vinylferrocene) material and/or any other high resistance material. Although the illustrated embodiment includes five delay elements 36a-36e, it will be appreciated that the first delay block 36 can include a greater and/or lesser number.

Figure 5:
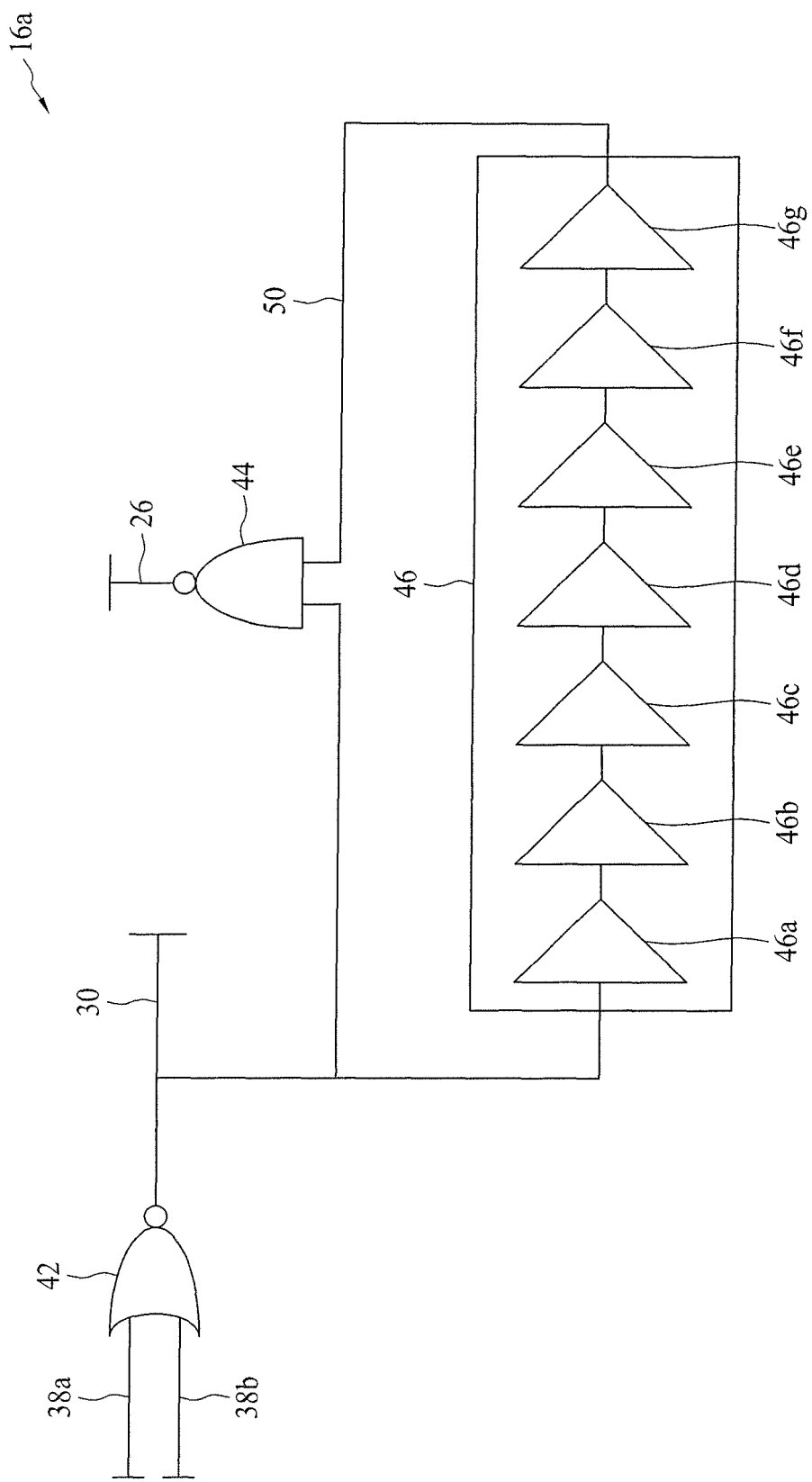
FIG. 5 illustrates an SD/SLP control block of the charging control circuit of FIG. 4, in accordance with some embodiments.

In some embodiments, the first charge signal 26 and the first control signal 30 are generated by the SD/SLP control block 16a. The SD/SLP control block 16a receives a plurality of input signals, such as an SD signal 38a and/or an SLP signal 38b and generates a plurality of output signals, such as a first charge signal 26 and/or a first control signal 30. FIG. 5 illustrates one embodiment of an SD/SLP control block 16a, in accordance with some embodiments.

FIG. 5 illustrates an embodiment of the SD/SLP control block 16a. The SD/SLP control block 16a includes one or more logic gates 42, 44 and a second delay block 46. As discussed above, the SD/SLP control block 16a receives a plurality of input signals, such as an SD signal 38a and an SLP signal 38b. The SD signal 38a and/or the SLP signal 38b are provided to a first logic gate 42 configured to generate a first control signal 30. When each of the SD signal 38a and the SLP signal 38b have a predetermined value, the first control signal 30 is set at a predetermined value (e.g., logic high or logic low). The first control signal 30 is provided to one or more additional circuit elements of the BL control block 14a, such as the control gate 24 of FIG. 4.

The first control signal 30 is further provided to a second delay block 46 and a first input of the output gate 44. The second delay block 46 is similar to the first delay block 36 discussed above, and similar description is not repeated herein. In some embodiments, the second delay block 46 includes a greater number of delay elements 46a-46g than the first delay block 36, such that the delay of the second delay block 46 is greater than the delay of the first delay block 36. The second delay block 46 generates a delayed output signal 50 which is provided to the output gate 44. In some embodiments, the delay of the second delay block 46 is equal to the predetermined delay period of the charge control circuit 12a.

When each of the first control signal 30 and the delayed output signal 50 have predetermined values (e.g., predetermined high and/or low logic values), the output of the output gate 44 is set to a predetermined value. The output of the output logic gate 44 can be provided to one or more additional logic gates, such as an inverter (not shown), to generate the first charge signal 26. The first charge signal 26 is provided to one or more circuit elements of the charge control block 14a, such as an output gate 22 of FIG. 4.

FIG. 6 is a timing diagram 200 of the charge control circuit 12a, in accordance with some embodiments. The timing diagram 200 illustrates a sub-set of the signals generated by the charge control circuit 12a, as shown in FIGS. 4-5. The signals are logic signals each having a first predetermined voltage corresponding to a logic-high value and a second predetermined voltage corresponding to a logic-low value. With reference now to FIGS. 4-6, operation of the charge control circuit 12a is discussed. As shown in FIG. 6, at time $t_0$, an SD signal 38a and an SLP 38b signal each have a logic-high value indicating a memory array coupled to a BL/BLB associated with the charge control circuit 12a is in sleep-mode. Each of the first control signal 30, the first charge signal 26, and the second charge signal 28 have initial logic-low values and the charge control signal 18a has an initial logic-high value (e.g., the charge control signal 18a is an active-low signal). At time $t_1$, a wake-up procedure is initiated and the SD signal 38a and the SLP signal 38b each transition to a logic-low value which initiates a multi-cycle charging process. At time $t_2$, the first logic gate 42 sets the first control signal 30 high.

As shown in FIG. 4, the first control signal 30 is provided to an input of the control gate 24 of the charge control block 14a. When the first control signal 30 is set high (i.e., set to a logic-high value), the second charge signal 28 is set high at time $t_3$. The second charge signal 28 is provided to an input of the output gate 22, which sets the charge control signal 18a low at time $t_4$. The logic-low charge control signal 18a turns on the charging transistors to charge the BL 8a and/or the BLB 8b to a first predetermined voltage. The first control signal 30 is also provided to the first delay block 36. The first delay block 36 delays the first control signal 30 by a first predetermined delay to generate a second control signal 32. The second control signal 32 is provided to the control gate 24. At time $t_5$, the second control signal 32 is set low, and the second charge signal 28 is reset low. At time $t_6$, the charge control gate 24 resets charge signal 18a to the logic-high value. The logic-high charge control signal 18a turns off the charging transistors 4.

Simultaneously, the first control signal 30 is provided to the second delay block 46. second delay block 46 generates a delayed output signal 50 by delaying the first control signal by the second predetermined delay period. When the first control signal 30 and the delayed output signal 50 each have a predetermined value (such as a logic-high value), the output logic gate 44 set the first charge signal 26 to a logic-high value. When the first charge signal 26 is set to logic-high, the charge control signal 18a is set to the logic-low value, and the BL 8a and/or BLB 8b charge from the first predetermined voltage to the second predetermined voltage.

Although specific two-stage embodiments of the charge control circuit 12a are discussed herein, it will be appreciated that the charge control circuit 12a can comprise any combination of logic gates, transistors, and/or other circuit elements configured to generate a multi-cycle charge control signal 18/18a.

In various embodiments, a circuit is disclosed. The circuit includes a first switch coupled to a voltage source and a bit-line (BL). The first switch is configured to couple the BL to the voltage source to charge the BL in response to a charge control signal. A second switch is coupled to the voltage source and a complimentary bit-line (BLB). The second switch is configured to couple the BLB to the voltage source to charge the BLB in response to the charge control signal. A control circuit is configured to generate the charge control signal. The charge control signal controls the first switch and the second switch to charge the BL and the BLB to an intermediate voltage during a first discrete charging period and to a target voltage during a second discrete charging period following the first discrete charging period.

In various embodiments, a method of charging a bit-line (BL) is disclosed. The method includes activating one or more switches for a first charging period. The one or more switches couple the BL to a voltage source to charge the BL to an intermediate voltage during the first charging period. The one or more switches are deactivated for a predetermined delay period. The one or more switches are then activated for a second charging period. The one or more switches couple the BL to the voltage source to charge the BL to a target voltage during the second charging period.

In various embodiments, a memory unit is disclosed. The memory unit includes a memory array comprising a plurality of bit-cells. Each of the plurality of bit-cells is coupled to a bit-line (BL) and a corresponding complimentary bit-line (BLB). A charging cell is coupled to the BL and the BLB. The charging cell comprises a first switch coupled to a voltage source and the BL. The first switch is configured to couple the BL to the voltage source to charge the BL in response to a charge control signal. A second switch is coupled to the voltage source and the BLB. The second switch is configured to couple the BL to the voltage source to charge the BLB in response to the charge control signal. A control circuit is configured to generate the charge control signal. The charge control signal controls the first switch and the second switch to charge the BL and the BLB to an intermediate voltage during a first discrete charging period and to a target voltage during a second discrete charging period following the first discrete charging period.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit comprising:
   a first switch coupled to a voltage source and a bit-line (BL), wherein the first switch is configured to couple the BL to the voltage source to charge the BL in response to a charge control signal;
   a second switch coupled to the voltage source and a complimentary bit-line (BLB), wherein the second switch is configured to couple the BLB to the voltage source to charge the BLB in response to the charge control signal; and
   a control circuit, wherein the control circuit is configured to generate the charge control signal, and wherein the charge control signal controls the first switch and the second switch to charge the BL and the BLB to an intermediate voltage during a first discrete charging period and to a target voltage during a second discrete charging period following the first discrete charging period, wherein the charge control signal is configured to turn on the first switch and the second switch for a first charging period to charge each of the BL and the BLB to the intermediate voltage, turn off the first transistor and the second transistor for a predetermined delay period, and turn on the first switch and the second switch for a second charging period to charge each of the BL and the BLB to the target voltage, wherein the predetermined delay period is selected such that a peak current on each of the BL and the BLB is less than a predetermined value.

2. The circuit of claim 1, comprising a third switch electrically coupled between the bit-line, the complimentary bit-line, and the control circuit, and wherein the third switch is configured to electrically couple the bit-line and the complimentary bit-line in response to the charge control signal.

3. The circuit of claim 2, wherein the third switch is a transistor coupled to the bit-line at a first drain/source terminal and the complimentary bit-line at a second drain/source terminal, and wherein the transistor is coupled to the control circuit at a gate.

4. The circuit of claim 1, wherein the first switch comprises a first transistor and the second switch comprises a second transistor, wherein a gate of the first transistor and a gate of the second transistor are each electrically coupled to the control circuit, and wherein the charge control signal is configured to turn each of the first transistor and the second transistor on/off.

5. The circuit of claim 1, wherein the control circuit comprises a charge block configured to receive a first input signal and a second input signal, wherein the second input signal is a time-delay signal having a delay corresponding to the predetermined delay period, and wherein the charge block is configured to generate the charge control signal in response to the first input signal and the second input signal.

6. The circuit of claim 5, wherein the control circuit comprises a sense detect (SD)/sleep (SLP) control block configured to receive an SD signal and an SLP signal and generate the first input signal and the second input signal of the pre-charge block, wherein the SD/SLP control bock comprises at least one delay block having a delay corresponding to the predetermined delay period.

7. The circuit of claim 1, comprising a memory array including a plurality of bit-cells, wherein each of the plurality of bit-cells is coupled to the BL and the BLB.

8. A circuit comprising:
a first switch coupled to a voltage source and a bit-line (BL), wherein the first switch is configured to couple the BL to the voltage source to charge the BL in response to a charge control signal;
a second switch coupled to the voltage source and a complimentary bit-line (BLB), wherein the second switch is configured to couple the BLB to the voltage source to charge the BLB in response to the charge control signal; and
a control circuit, wherein the control circuit is configured to generate the charge control signal, and wherein the charge control signal controls the first switch and the second switch to charge the BL and the BLB to an intermediate voltage during a first discrete charging period and to a target voltage during a second discrete charging period following the first discrete charging period, wherein the charge control signal is configured to turn on the first switch and the second switch for a first charging period to charge each of the BL and the BLB to the intermediate voltage, turn off the first transistor and the second transistor for a predetermined delay period, and turn on the first switch and the second switch for a second charging period to charge each of the BL and the BLB to the target voltage, wherein the control circuit comprises a charge block configured to receive a first input signal and a second input signal, wherein the second input signal is a time-delay signal having a delay corresponding to the predetermined delay period, and wherein the charge block is configured to generate the charge control signal in response to the first input signal and the second input signal.

9. The circuit of claim 8, wherein the control circuit comprises a sense detect (SD)/sleep (SLP) control block configured to receive an SD signal and an SLP signal and generate the first input signal and the second input signal of the pre-charge block, wherein the SD/SLP control bock comprises at least one delay block having a delay corresponding to the predetermined delay period.

10. The circuit of claim 8, comprising a third switch electrically coupled between the bit-line, the complimentary bit-line, and the control circuit, and wherein the third switch is configured to electrically couple the bit-line and the complimentary bit-line in response to the charge control signal.

11. The circuit of claim 10, wherein the third switch is a transistor coupled to the bit-line at a first drain/source terminal and the complimentary bit-line at a second drain/source terminal, and wherein the transistor is coupled to the control circuit at a gate.

12. The circuit of claim 8, wherein the first switch comprises a first transistor and the second switch comprises a second transistor, wherein a gate of the first transistor and a gate of the second transistor are each electrically coupled to the control circuit, and wherein the charge control signal is configured to turn each of the first transistor and the second transistor on/off.

13. The circuit of claim 8, comprising a memory array including a plurality of bit-cells, wherein each of the plurality of bit-cells is coupled to the BL and the BLB.

14. A method comprising:
activating one or more switches for a first charging period, wherein the one or more switches couple the BL to a voltage source to charge the BL to an intermediate voltage during the first charging period;
deactivating the one or more switches for a predetermined delay period; and
activating the one or more switches for a second charging period, wherein the one or more switches couple the BL to the voltage source to charge the BL to a target voltage during the second charging period, wherein the predetermined delay period is configured such that a peak voltage of the BL does not exceed a predetermined current value during either of the first charging period or the second charging period.

15. The method of claim 14, wherein activating the one or more switches comprises setting a charge control signal to a predetermined value.

16. The method of claim 14, receiving one or more input signals at a charge control circuit, wherein the charge control circuit activates and deactivates the one or more switches in response to the one or more input signals.

17. The method of claim 14, comprising setting the voltage source to the intermediate voltage, wherein the voltage source is coupled to at least one of the one or more switches, and wherein the voltage source is set to the intermediate voltage prior to the first charging period.

18. The method of claim 17, setting the voltage source to the target voltage, and wherein the voltage source is set to the target voltage prior to the second charging period.

19. The method of claim 14, wherein the predetermined current value is less than or equal to a read/write current value of a memory array coupled to the BL.

20. The method of claim 14, wherein the one or more switches each comprise a transistor, and wherein activating the one or more switches comprises providing a predetermined voltage to a gate of each of the transistors.

* * * * *